(12) United States Patent
Taniguchi

(10) Patent No.: US 9,332,651 B2
(45) Date of Patent: May 3, 2016

(54) PROCESS FOR PRODUCING STRUCTURE WITH METAL FILM, MOTHER DIE FOR USE IN THE PROCESS, AND STRUCTURE PRODUCED BY THE PROCESS

(75) Inventor: Jun Taniguchi, Tokyo (JP)

(73) Assignee: TOKYO UNIVERSITY OF SCIENCE FOUNDATION, Tokyo (JP)

( * ) Notice: Subject to any disclaimer, the term of this patent is extended or adjusted under 35 U.S.C. 154(b) by 123 days.

(21) Appl. No.: 12/675,537

(22) PCT Filed: Feb. 9, 2009

(86) PCT No.: PCT/JP2009/052183
§ 371 (c)(1),
(2), (4) Date: Feb. 26, 2010

(87) PCT Pub. No.: WO2009/099235
PCT Pub. Date: Aug. 13, 2009

(65) Prior Publication Data
US 2010/0308204 A1   Dec. 9, 2010

(30) Foreign Application Priority Data

Feb. 8, 2008   (JP) .................................. 2008-029631
Sep. 11, 2008  (JP) .................................. 2008-233873

(51) Int. Cl.
*H05K 3/00*   (2006.01)
*H05K 3/20*   (2006.01)
(Continued)

(52) U.S. Cl.
CPC .............. *H05K 3/205* (2013.01); *C23C 4/185* (2013.01); *C23C 14/0005* (2013.01);
(Continued)

(58) Field of Classification Search
CPC . H05K 3/205; H05K 3/20; H05K 2203/0108; H05K 2203/1152; C23C 4/185; C23C 14/0005; C23C 14/025; C23C 14/16; C23C 26/00

USPC ................ 264/1.1, 1.33, 2.5, 106, 107, 219; 425/810
See application file for complete search history.

(56) References Cited

U.S. PATENT DOCUMENTS 4,116,753 A  *  9/1978  Tojyo et al. ....................... 216/14
4,188,240 A  *  2/1980  Yoshio ........................... 148/272
(Continued)

FOREIGN PATENT DOCUMENTS

JP  63-112842     *  5/1988
JP  02-073987 A     3/1990
(Continued)

OTHER PUBLICATIONS

Ojima, et al., "Printing electrode for top-contact molecular junction," Applied Phtysics Letters, 87:234110 (2005).
(Continued)

*Primary Examiner* — Mathieu Vargot
(74) *Attorney, Agent, or Firm* — Marshall, Gerstein & Borun LLP

(57) ABSTRACT

The invention provides is a process for producing a structure (22) with a metal film, including the steps of preparing a mother die (10) in which a first metal film (16) is formed on the surface of a base (12) on which a concave and convex pattern (14) is formed, forming a second metal film (18) on the first metal film (16), adhering a support member (20) to the second metal film (18), and separating the second metal film (18) to which the concave and convex pattern has been transferred to the second metal film (18) together with the support member from the first metal film (16). Preferably, the first metal film (16) is a film containing Cr and Al, and the second metal film (18) is a film containing at least one metal selected from the group consisting of Au, Ag, Cu, Al, and Pt.

6 Claims, 15 Drawing Sheets

(51) Int. Cl.
  *C23C 4/18* (2006.01)
  *C23C 14/00* (2006.01)
  *C23C 14/02* (2006.01)
  *C23C 14/16* (2006.01)
  *C23C 26/00* (2006.01)

(52) U.S. Cl.
  CPC .............. *C23C 14/025* (2013.01); *C23C 14/16* (2013.01); *C23C 26/00* (2013.01); *H05K 3/20* (2013.01); *H05K 2203/0108* (2013.01); *H05K 2203/1152* (2013.01)

(56) References Cited

U.S. PATENT DOCUMENTS

| | | | |
|---|---|---|---|
| 4,482,511 A * | 11/1984 | Komatsubara | 264/483 |
| 5,388,803 A * | 2/1995 | Baumgartner et al. | 249/111 |
| 6,190,838 B1 * | 2/2001 | Kerfeld | 430/320 |
| 6,786,737 B2 | 9/2004 | Tai et al. | |
| 6,792,679 B1 | 9/2004 | Tai et al. | |
| 6,814,897 B2 * | 11/2004 | Morita | 264/1.33 |
| 2006/0254053 A1 * | 11/2006 | Chanda et al. | 29/847 |

FOREIGN PATENT DOCUMENTS

| | | |
|---|---|---|
| JP | 02-303820 A | 12/1990 |
| JP | 10-330123 | 12/1998 |
| JP | 2000-327344 A | 11/2000 |
| JP | 2001210933 A | 8/2001 |
| JP | 2002-020129 A | 1/2002 |
| JP | 2004063694 A | 2/2004 |
| JP | 2004186453 A | 7/2004 |
| JP | 2004/338999 A | 12/2004 |
| JP | 2005051095 A | 2/2005 |
| JP | 2005/239519 A | 9/2005 |
| JP | 2005340432 A | 12/2005 |
| JP | 2006150741 A | 6/2006 |
| JP | 2006-176344 A | 7/2006 |
| JP | 2006-196768 A | 7/2006 |

OTHER PUBLICATIONS

Notice of Reasons for Rejection for Japanese Application No. 2009-552564, dated Feb. 26, 2013.
Decision of Refusal for Japanese Application No. 2009-552564, dated Nov. 28, 2013.
Notice of Reasons for Rejection in JP Application No. 2014-040990 dated Mar. 3, 2015.

* cited by examiner (A)          (B)

(A)

(B)

(C)

(A) AU-DEPOSITED SAMPLE AFTER MOLD RELEASE AGENT TREATMENT (B) AU-DEPOSITED SAMPLE AFTER CR DEPOSITION

MAGNIFICATION × 10000

MAGNIFICATION × 40000

(1) AU COATING (2) CONTACT PRINTING (3) ETCHING (4) PATTERN FORMATION (1) AU/TI COATING (2) CONTACT PRINTING (3) TRANSFER (A)

(B)

(A)

(B)

US 9,332,651 B2

PROCESS FOR PRODUCING STRUCTURE WITH METAL FILM, MOTHER DIE FOR USE IN THE PROCESS, AND STRUCTURE PRODUCED BY THE PROCESS

TECHNICAL FIELD

The present invention relates to a process for producing a structure with a metal film, a mother die for use in the process, and a structure produced by the process.

BACKGROUND ART

As one of the processes for forming a fine circuit pattern of μm order or nm order on substrates, such as glass or resin, a process involving transferring a die (master) corresponding to a fine pattern to be formed is mentioned.

For example, a process including forming a conductive film on a glass substrate, forming a given pattern by photoresist on the conductive film, forming a plating film at a portion where the conductive film is exposed, and further bonding a base film to the plating film to thereby transfer the plating film is disclosed (Japanese Patent Application Laid-Open (JP-A) No. 2004-63694).

Moreover, a process including applying a mold release agent to a mold on which a given concave and convex pattern is formed, forming a gold (Au) deposited film through the mold release agent, and pressing the Au film formed on convex portions against a substrate for transferring is disclosed (APPLIED PHYSICS LETTERS 87, 234110 (2005) "Printing electrode for top-contact molecular junction").

Furthermore, a transfer process as illustrated in FIG. 12 has also been proposed. More specifically, an Au film 32 is formed on an Si substrate 30, and, separately, an alkanethiol film 34 is provided on a concave and convex pattern surface of a master 36 formed with PDMS (polydimethylsiloxane). Then, the alkanethiol film 34 on the convex portions is bonded to the Au film 32 for transferring. Subsequently, by reactive ion etching (RIE) of the Au film 32, the Au film 32 and the substrate 30 at a portion which is not masked by the alkanethiol film 34 are etched, and thus the pattern of the Au film 32 remains on a portion which is masked by the alkanethiol film 34.

Moreover, as illustrated in FIG. 13, a process including successively forming the Au film 32 and a Ti film 38 on the concave and convex pattern surface of the PDMS master 36, and transferring the Ti film and the Au film formed on the convex portions onto a substrate 40, such as Si, has also been proposed.

DISCLOSURE OF THE INVENTION

It is an object of the present invention to provide a process for producing a structure with a metal film to which a concave and convex pattern of a mother die has been transferred by transfer while preventing damages to the fine concave and convex pattern of the mother die, a mother die for use in the process, and a structure produced by the process.

In order to achieve the object, the present invention provides the following process for producing a structure with a metal film, a mother die for use in the process, and a structure produced by the process.

A first aspect of the invention provides a process for producing a structure with a metal film, including:
preparing a mother die in which a first metal film is formed on the surface of a base on which a concave and convex pattern is formed,
forming a second metal film on the first metal film,
adhering a support member to the second metal film, and
separating the second metal film, to which the concave and convex pattern has been transferred to the second metal film together with the support member from the first metal film.

A second aspect of the invention provides a mother die, having:
a base at the surface of which a concave and convex pattern is formed; and
a metal film formed on the surface of the base, on which the concave and convex pattern is formed.

BRIEF DESCRIPTION OF DRAWINGS

FIG. 4(A) is an SEM image after a 20 nm thick Cr film (first metal film) is formed and FIG. 4(B) is a 1 μm thick Au film (second metal film) is formed.

FIG. 10(a) illustrates Comparative Example 3 and FIG. 10(b) illustrates Example 2.

FIG. 11(a) illustrates the SEM image with a magnification of 10000 times and FIG. 11(b) illustrates the SEM image with a magnification of 40000 times.

FIG. 16(A) illustrates the results before transfer and FIG. 16(B) illustrates the results after transfer.

FIG. 19(A) illustrates the case where the designed groove width is 200 nm and FIG. 19(B) illustrates the case where the designed groove width is 100 nm.

BEST MODE FOR CARRYING OUT THE INVENTION

Hereinafter, the present invention will be described with reference to the attached drawings.

It is considered that, when a concave and convex pattern of nm order is transferred onto a resin or the like, the aspect ratio within about 2 is a threshold value for stable transfer. Then, the present inventors have repeatedly conducted studies on a method for forming a metal film having a fine concave and convex pattern of nm order by transfer. As a result, the present inventors have found that, when a concave and convex pattern to be transferred (hereinafter sometimes referred to as a "transfer pattern" or a "pattern") is formed beforehand on the surface of a base serving as a mother die, subsequently a first metal film serving as a protective film is formed on the surface on which the transfer pattern has been formed, a second metal film is further formed thereon in such a manner as not to chemically bond to the first metal film, and the second metal film is transferred to a support member, the second metal film to which the transfer pattern has been transferred can be securely transferred to the support member side and also the second metal film can be repeatedly transferred while preventing damages to the fine concave and convex pattern of the mother die. Thus, the present invention has been accomplished.

Figure 1:
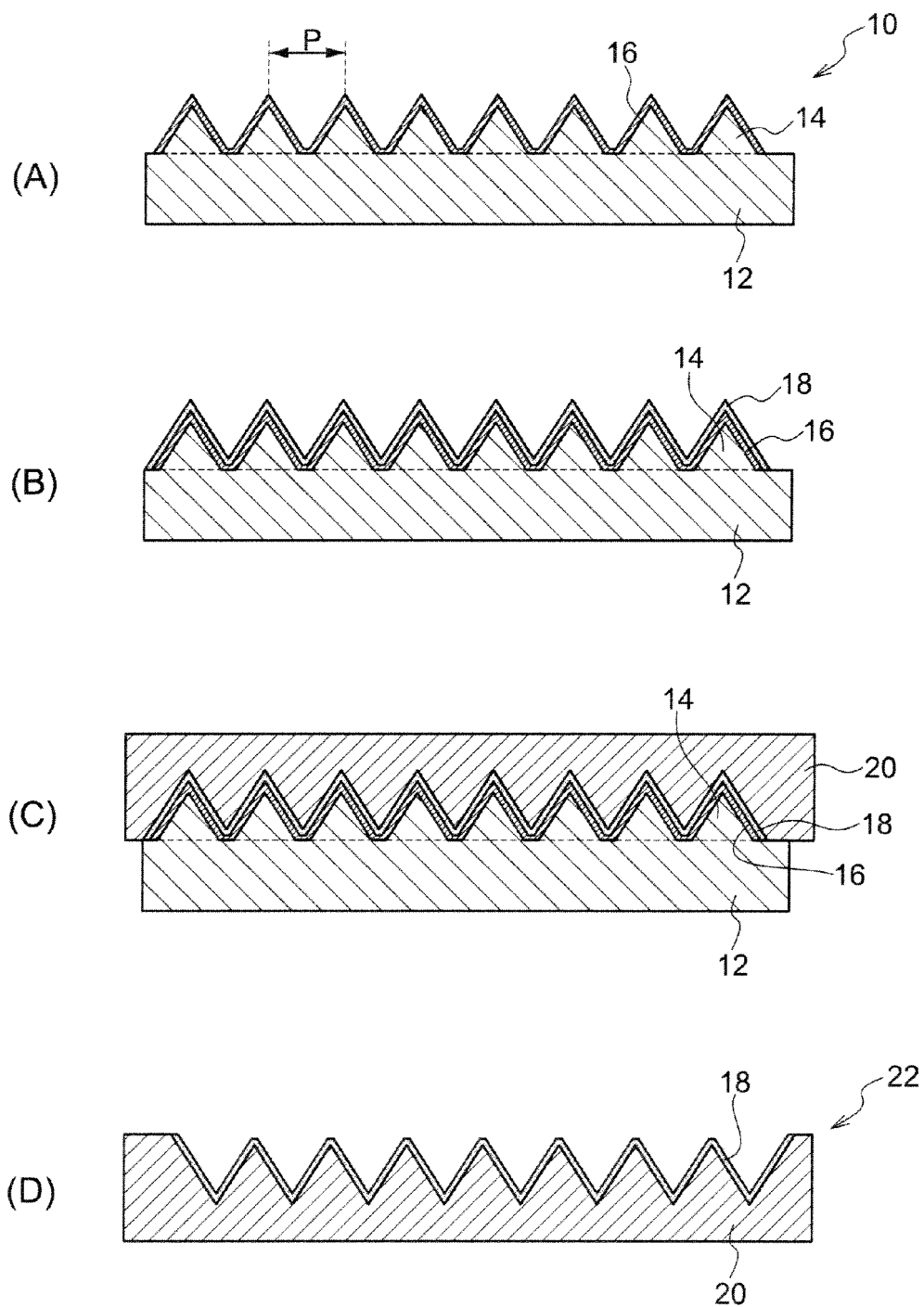
FIG. 1 shows an example of a process for producing a structure with a metal film by the present invention.

FIG. 1 shows an example of a process for producing a structure with a metal film according to the present invention. More specifically, the process for producing a structure with a metal film according to the invention, includes:

(A) preparing a mother die 10 in which a first metal film 16 is formed on the surface of a base 12 on which a concave and convex pattern 14 is formed, (B) forming a second metal film 18 on the first metal film 16, (C) adhering a support member 20 onto the second metal film 18, and (D) separating the second metal film 18, to which the concave and convex pattern 14 has been transferred, together with the support member 20 from the first metal film 16. Hereinafter, the process will be specifically described in accordance with each step.

(A) Preparation of Mother Die

First, a mother die (master) 10 in which a first metal film (protective film) 16 is formed on the surface of a base 12 on which a concave and convex pattern 14 is formed is prepared (FIG. 1 (A)).

<Base>

The material or shape of the base 12 serving as the body of the mother die 10 is not particularly limited insofar as the concave and convex pattern 14 to be transferred to the second metal film 18 later can be formed and the first metal film 16 and the second metal film 18 can be successively formed on the surface on which the concave and convex pattern 14 is formed.

Preferable examples of the material (mold material) of the base 12 include silicon, glassy carbon, quartz, ceramics, and metals from the viewpoints of the formability of the pattern 14, the mechanical strength and heat resistance as the mother die 10, the film formability of the metal film and the like.

The concave and convex pattern 14 on the surface of the base 12 may be formed according to the purpose, and the concave and convex pattern 14 may be formed as desired on the surface of the base 12 by, for example, lithography, electron beam processing, ion beam processing and the like.

For example, for the purpose of obtaining a circuit pattern containing the second metal film 18 after a transfer process, a desired circuit pattern can be formed on the surface (one side) of the base 12, such as a silicon substrate, by, for example, lithography (photo lithography, electron-beam lithography, etc.) and etching. Moreover, an SOG (Spin on Glass) is baked on a flat substrate, such as a silicon substrate, and then can be formed into a concave and convex pattern.

For the purpose of increasing the surface area by forming fine projections of nm order at the surface of the second metal film 18, fine projections of nm order can be formed at the surface (processed surface) of the base 12 by ion beam processing of the base 12, such as glassy carbon (GC). For example, when the GC base is subjected to ion beam processing by ECR (Electron Cyclotron Resonance), a pattern containing fine projections having a shape in which the diameter decreases from the bottom towards the top end thereof, such as a needle shape, a conical shape, or a pyramid shape, can be formed. Such a transfer pattern containing projections having a shape in which the diameter decreases from the bottom towards the top end thereof is advantageous in that transfer (separation) is facilitated rather than a transfer pattern containing projections in which the diameter is almost fixed, such as a cylindrical shape. In the processing by ECR, the height or the pitch of the projections to be formed at the surface of the base can be controlled to some extent by adjusting the processing time, acceleration voltage, and gas flow rate (see JP-A No. 2008-233850).

<First Metal Film>

Since the first metal film 16 constitutes the mother die 10 with the base 12, the first metal film 16 is formed with metals (simple metals or metal compounds, such as alloys or metal oxides) having high adhesiveness with materials constituting the base 12 (hereinafter referred to as a mold material) and not chemically bonding to the second metal film 18 to be formed on the first metal film 16 in the following step.

In order to obtain high adhesiveness with the base 12, the first metal film 16 is preferably a film that forms a compound with the mold material and forms an intermediate layer. For example, a film containing chromium (Cr) is mentioned. For example, when the mold material is quartz, a film is formed using Cr on the quartz, a chrome oxide ($Cr_2O_3$) that is stable as an intermediate layer is formed, and a Cr film having high adhesiveness is obtained. Moreover, also when the mold material is SOG, a stable chrome oxide is similarly formed and a Cr film having high adhesiveness is obtained.

In contrast, when the base 12 is formed with carbon, such as glassy carbon, chromium carbide ($Cr_2C_3$, CrC) is formed as an intermediate layer when chromium is formed on the surface, and then a Cr film having high adhesiveness is similarly obtained.

The first metal film 16 is not limited to the Cr film, and materials may be selected according to adhesiveness with mold materials and ease of separation from the second metal film 18.

The first metal film 16 is preferably a film containing metal compounds, such as metal oxides or metal carbides, rather than a film containing simple metals, and metal oxide films are particularly preferable. Metals constituting the first metal film 16 are preferably aluminum (Al) in addition to Cr. It is estimated that both Cr and Al are naturally oxidized in the air and stabilized after formed into films to be closely adhered to the base 12 and also the chemical bonding with the second metal film 18 is suppressed, which facilitates the separation of the second metal film 18.

The first metal film 16 may be intentionally subjected to oxidation treatment, nitriding treatment, carbonization treatment, etc., to be formed into a film containing metal compounds.

Methods for forming the first metal film 16 are not particularly limited. Preferable examples include vapor deposition, coating, and plating. The film forming methods may be selected according to the materials of the first metal film 16 and the mold materials constituting the base 12.

The thickness of the first metal film 16 may be determined according to, for example, the pitch P of the concave and convex pattern 14 of the base 12. When the thickness of the first metal film 16 is excessively thin, the first metal film does not sufficiently function as a protective film and thus the concave and convex pattern 14 may be partially damaged by transfer. In contrast, when the thickness of the first metal film 16 is excessively thick, the concave and convex pattern 14 may be flattened and thus the transfer pattern 14 of the base 12 may be difficult to be transferred to the second metal film 18. Considering the above respects, the thickness of the first metal film 16 depends on the pitch P between the convex portions of the transfer pattern 14 and is preferably 1 to 3000 nm, more preferably 3 to 1000 nm, and particularly preferably 5 to 100 nm.

(B) Formation of Second Metal Film

The mother die 10 constituted by the base 12 and the first metal film 16 described above is prepared, and then the second metal film 18 is formed on the first metal film 16 (FIG. 1(B)).

<Second Metal Film>

The second metal film 18 is formed on the first metal film 16 formed on the transfer pattern surface side of the base 12. Since the second metal film 18 is separated from the first metal film 16 after the support member 20 is adhered in a transfer step later, the second metal film 18 is formed with metals (simple metals or metal compounds, such as alloys or metal oxides) that do not chemically bond to the first metal film 16.

The second metal film 18 may be selected according to the purpose of a structure 22 having the metal film 18 to be obtained after transfer. Examples of the second metal film 18 include films containing at least one metal selected from the group consisting of Au, Ag, Cu, Al, and Pt. When the second metal film 18 is a metal film which contains such materials and to which the transfer pattern 14 of the mother die 10 has been transferred, the film can serve as, for example, a functional film having functions of a catalyst and the like. When a Cr film is formed as the first metal film 16, an alloy or the like with Cr is not produced and thus the second metal film 18 can be relatively easily transferred (separated).

When an Al film is formed as the first metal film 16, a film containing Cu or constantan (alloy of Ni and Cu) as metals constituting the second metal film 18 is preferable and a Cu film is particularly preferable.

The second metal film 18 is not limited to films containing the metals mentioned above and the materials thereof may be selected according to the purpose.

Film forming methods for the second metal film 18 are not limited insofar as a film can be formed with a desired thickness in such a manner as not to chemically bond to the first metal film 16, and may be selected considering the materials constituting the second metal film 18, the materials constituting the first metal film 16, and the mold materials constituting the base 12. It is preferable to form the second metal film 18 by vapor deposition, coating, or plating from the viewpoints of ease of film formation, film thickness uniformity, etc.

The thickness of the second metal film 18 is not particularly limited. When the thickness of the second metal film 18 is excessively thin, the film may be damaged in the transfer process. When the thickness thereof is excessively thick, an increase in the cost or poor transfer may be caused. Considering the above respects, the thickness of the second metal film 18 depends on the pitch P between the convex portions of the transfer pattern 14 and is preferably 10 to 3000 nm, more preferably 50 to 2000 nm, and particularly preferably 100 to 1500 nm.

<Mold Release Agent>

Before forming the second metal film 18, a mold release agent may be supplied between the first metal film 16 and the second metal film 18. Preferable examples of the mold release agent include a silane coupling agent. When the mold release agent is supplied between the first metal film 16 and the second metal film 18, only the second metal film 18 can be more securely transferred.

(C) Adhesion of Support Member

The second metal film 18 is formed on the first metal film 16, and then the support member 20 is adhered to the second metal film 18 (FIG. 1(C)).

<Support Member>

Since the support member 20 is adhered to the second metal film 18 and separated from the first metal film 16, the support member 20 may be selected according to adhesiveness with the second metal film 18 and the purpose after transfer. As such a support member 20, resin and glass can be preferably used.

Examples of the resin include resins that have fluidity before supplied to the second metal film 18, thereby can be easily supplied, and that may be cured by the application of external energy, such as light or heat after supplied, and ultraviolet curable resins are particularly preferable. Methods for supplying a curable resin are not particularly limited, and may be suitably selected from known coating methods, such as squeegee coating or spin coating, according to the viscosity or the like of a curable material.

When an ultraviolet curable resin is applied to the second metal film 18, the resin is irradiated with ultraviolet ray of photosensitive wavelength for curing. When a thermosetting resin is used, the resin is heated to a given temperature for curing. Even when the concave and convex pattern has a high aspect ratio (e.g., 2 or more), the use of a curable resin composition which is in the form of liquid at room temperature allows preferable charging and curing thereof between the convex portions. In this case, the resin can be adhered throughout the second metal film formed on the mother die 10. After curing, the second metal film 18 formed between the convex portions can also be preferably transferred to the support member 20.

Moreover, a resin film (PET film or the like) that is softened by heating while being in contact with the second metal film 18, and then is adhered to the second metal film 18 when cured by cooling can also be used.

Moreover, for example, a glass material, such as SOG (Spin on Glass) can also be preferably used as the support member 20. The SOG can be spin coated onto the metal film, and then can be baked at relatively low temperatures (e.g., 250 to 500° C.). Thus, adverse effects caused by heating to the base 12, the first metal film 16, and the second metal film 18 can be suppressed.

(D) Transfer (Separation)

The support member 20 is adhered to the second metal film 18, and then the second metal film 18, to which the concave and convex pattern 14 has been transferred, is separated with the support member 20 from the first metal film 16 (FIG.

1(D)). Thus, the second metal film 18 is transferred to the support member 20 side, thereby obtaining a structure 22 having the second metal film 18 to which the transfer pattern 14 of the base 12 has been transferred.

In the second metal film 18 transferred through the steps, the transfer pattern 14 of the base 12 is transferred to the surface of the second metal film 18. The second metal film 18 is a film to which a film formed through the first metal film 16 has been transferred. Therefore, the surface state is favorable compared with a film formed on the surface of the base 12 on which the transfer pattern 14 has been formed directly or only through a mold release agent, and then transferred. For example, even in the case of a circuit pattern having a line width of nm order, disconnection can be effectively prevented.

Moreover, when the base 12 at the surface of which fine projections are formed is used, for example, the fine structure of the base 12 is transferred with favorable precision to the surface of the first metal film 16 after transfer, thereby obtaining the structure 22 having the second metal film 18 whose surface area is extremely large.

In contrast, the mother die 10 after transfer can be repeatedly used as a mother die, because the transfer pattern 14 is protected by the first metal film 16, and thus, damages when the second metal film 18 is separated are suppressed. More specifically, by successively repeating, after transfer, (B) the formation of the second metal film 18 on the first metal film 16, (C) the adhesion of the support member 20 to the second metal film 18, and (D) the separation between the first metal film 14 and the second metal film 18, the structure 22 having the second metal film to which the transfer pattern 14 of the base 12 has been transferred can be mass produced at a low cost.

EXAMPLES

Hereinafter, Examples and Comparative Examples will be described, but the present invention is not limited to the following Examples.

Example 1-1

—Base Surface Treatment—

The surface of a substrate (Thickness: 1 mm, Length and Width: 10 mm×10 mm) of glassy carbon whose surface was polished (manufactured by Tokai Carbon Co., Ltd.) was subjected to ion beam processing using an ECR (Electron Cyclotron Resonance) type ion beam processing device (trade name: EIS-200ER, manufactured by Elionix Co., Ltd.) having the structure illustrated in FIG. 2.

An ion beam processing device 50 for use in the ion beam processing has a holder 66 for holding a substrate 52, a gas introduction pipe 54, a plasma generating chamber 56, an extractor 58, an electromagnet 60, an ion beam withdrawing electrode 62, a Faraday cup 64, etc. The current density becomes low at a low acceleration voltage of, for example, 500 V or lower, and thus, in order to increase the current density, the extractor 58 functions as a grid for withdrawing ions at a plasma side from the withdrawing electrode 62. When the extractor 58 is used, the current density becomes high to increase the processing speed even when the acceleration voltage is low.

The glassy carbon substrate (GC substrate) 52 is placed on the holder 66, oxygen was introduced as a reactant gas, and also a given acceleration voltage is applied, thereby subjecting the surface of the GC substrate 52 to ion beam processing. The processing conditions are as follows.

Figure 3:
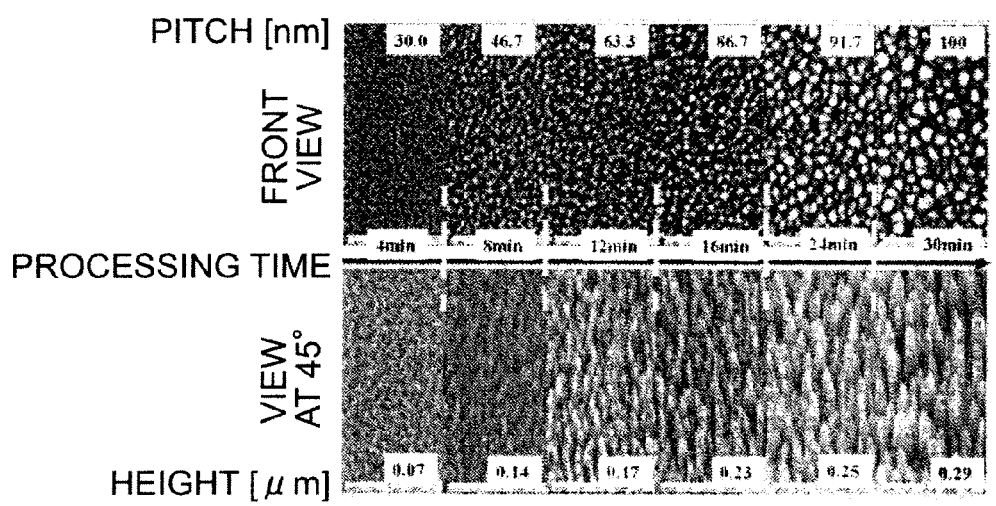
FIG. 3 shows SEM images obtained by observing the surface of a glassy carbon substrate processed by ECR while changing the processing time.

Beam emitting angle: vertical to the processed surface (90° relative to the transfer pattern surface of the substrate)
Reactant gas: oxygen
Gas flow rate: 3.0 SCCM
Microwave: 100 W
Acceleration voltage: 500 V
Degree of vacuum: $1.3 \times 10^{-2}$ Pa FIG. 3 shows SEM images showing the surface state of the GC substrate that was processed while changing the processing time. As is seen in FIG. 3, on the surface (processed surface) of the GC substrate, a pattern containing fine projections having a shape in which the diameter decreases towards the top end is formed, and the height and pitch of the projections changed according to the processing time.

—Formation of Cr Film—

A chromium (Cr) film was formed on the processed surface of the GC substrate that was processed by ECR for 5 minutes. Here, a 20 nm thick Cr deposited film was formed using a vacuum deposition device (trade name: CPC-260F, manufactured by Shinku Kiko Co., Ltd). FIG. 4(A) shows SEM images after a Cr deposited film was formed on the fine pattern surface of the GC substrate.

—Formation of Au Film—

Figure 4:
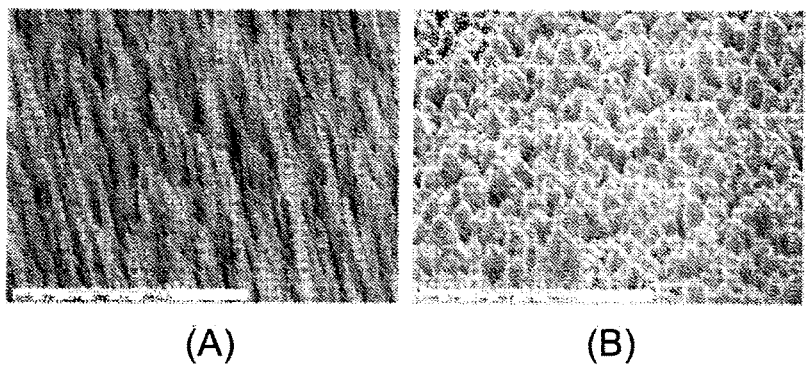
FIG. 4 shows SEM images after a metal film is formed on a GC substrate on which a fine pattern has been formed.

A 1 μm thick Au deposited film was formed on the Cr film using the vacuum deposition device (trade name: CPC-260F) after the Cr film was formed on the fine pattern surface of the GC substrate. FIG. 4 (B) shows an SEM image after the Au film was formed.

—Transfer—

After the Au film was formed, a photocurable resin (trade name: PAK-01, manufactured by Toyo Gosei Co., Ltd.) was spin coated onto the Au film. A slide glass was pressed against the PAK-01 coated surface under the following conditions, and ultraviolet light was emitted from the slide glass side to cure the PAK-01.

Figure 5:
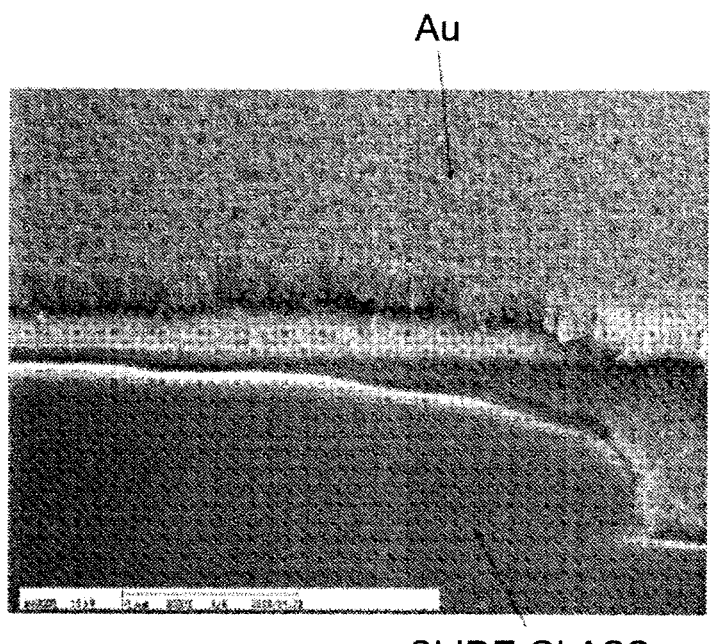
FIG. 5 shows an SEM image showing the Au film transferred to a slide glass through adhesives.

Pressing pressure: 1.2 MPa
Pressurization time: 60 seconds
UV irradiation time: 4 seconds After curing, the slide glass and the GC substrate were slowly separated from each other. FIG. 5 shows an SEM image of the Au film transferred onto the slide glass through the PAK-01, which shows that fine projection-like convex and concave portions are formed on the Au film.

Figure 6:
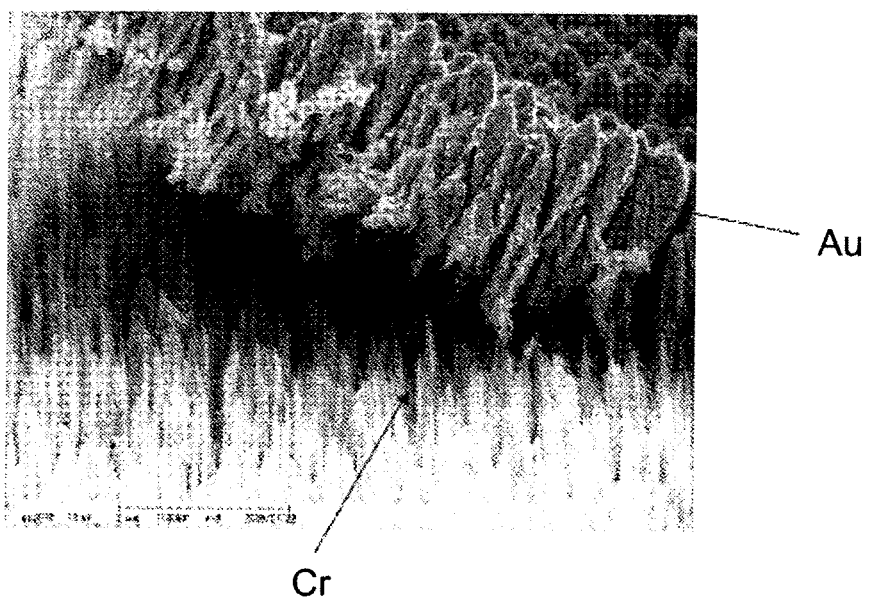
FIG. 6 shows an SEM image showing a concave and convex (projection) pattern of a mother die after the Cr film and the Au film are separated.

In contrast, FIG. 6 shows an SEM image showing the mother die after separation, which shows that the projections are not damaged.

Examples 1-2, 1-3

The processing, film formation, and transfer were performed in a manner substantially similar to that in Example 1-1, except changing the processing time of the GC substrate to 10 minutes or 15 minutes.

Comparative Example 1-1

The GC substrate was subjected to ion beam processing in a manner substantially similar to that in Example 1-1, and then a mold release agent (trade name: DURASURF HD-1101Z, manufactured by HARVES Co., Ltd.) was applied to the processed surface. Subsequently, a photocurable resin (trade name: PAK-01, manufactured by Toyo Gosei Co., Ltd.) was spin coated thereto. The PAK-01 coated surface was pressed against a slide glass, and simultaneously ultraviolet light was emitted under the same conditions as that in Example 1 to cure the PAK-01. After curing, the slide glass and the GC substrate were slowly separated from each other.

Comparative Example 1-2

The processing, coating of a mold release agent, and transfer were performed in a manner substantially similar to that in Comparative Example 1-2, except changing the processing time of GC substrate to 10 minutes.

Comparative Example 2-1

The GC substrate was subjected to ion beam processing in a manner substantially similar to that in Example 1-1, and then an Au film was directly formed on the processed surface. Here, a 70 nm thick Au deposited film was formed using a vacuum deposition device (trade name: CPC-260F, manufactured by Shinku Koki Co., Ltd).

Subsequently, a photocurable resin (trade name: PAK-01, manufactured by Toyo Gosei Co., Ltd.) was spin coated onto the Au film. A slide glass was pressed against the PAK-01 coated surface, and simultaneously ultraviolet light was emitted under the same conditions in Example 1 to cure the PAK-01.

After curing, the slide glass and the GC substrate were slowly separated from each other.

Comparative Examples 2-2, 2-3

The processing, film formation, and transfer were performed in a manner substantially similar to that in Comparative Example 2-1, except changing the processing time of the GC substrate to 10 minutes or 15 minutes.

The transfer results in Example 1-1 to Comparative Example 2-3 above are shown in Table 1. The transfer evaluation in Table 1 is as follows.

A: All the Au films (PAK-01 in Comparative Example 2) were transferred to the slide glass side.
B: The Au films (PAK-01 in Comparative Example 2) partially remained on the GC substrate side.
C: The Au films (PAK-01 in Comparative Example 2) were not transferred.

TABLE 1

|  | Base processing time (minute) | Structure before transfer | Transfer evaluation |
|---|---|---|---|
| Ex. 1-1 | 5 | GC/Cr/Au/PAK-01 | A |
| Ex. 1-2 | 10 | GC/Cr/Au/PAK-01 | A |
| Ex. 1-3 | 15 | GC/Cr/Au/PAK-01 | B |
| Comp. Ex. 1-1 | 5 | GC/Mold release agent/PAK-01 | C |
| Comp. Ex. 1-2 | 10 | GC/Mold release agent/PAK-01 | C |
| Comp. Ex. 2-1 | 5 | GC/Au/PAK-01 | B |
| Comp. Ex. 2-2 | 10 | GC/Au/PAK-01 | B |
| Comp. Ex. 2-3 | 15 | GC/Au/PAK-01 | C |

Example 2

Figure 7:
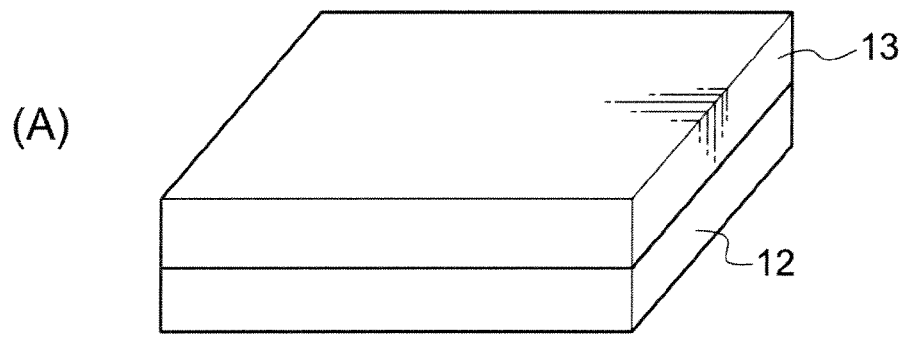
FIG. 7 shows an example of a process for forming an SOG concave and convex pattern on an Si substrate in Example 2.
Figure 7:
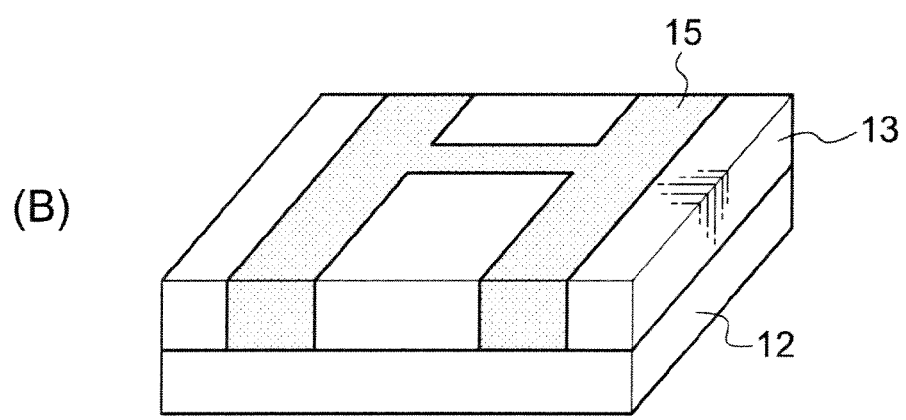
Figure 7:
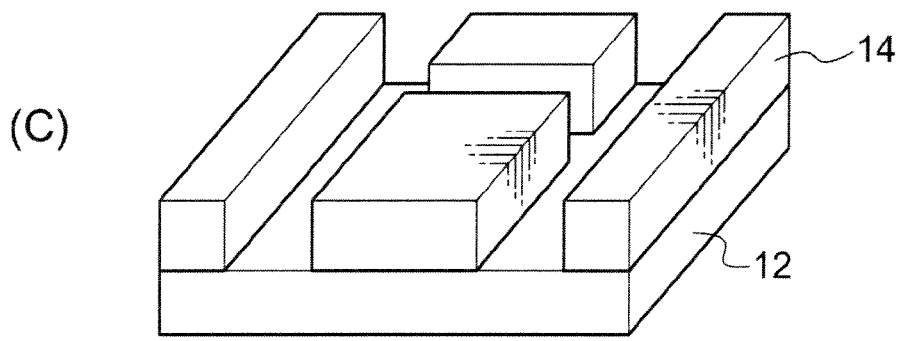

As illustrated in FIG. 7(A), an SOG (trade name: ACCUGLASS (registered trademark) 512B, manufactured by Honeywell, Inc.) 13 was spin coated onto an Si wafer 12, and baked (pre-heating: 80° C. for 3 minutes, main heating: 425° C. for 1 hour).

Subsequently, as illustrated in FIG. 7(B), a resist was applied and arbitrary portions 15 were irradiated with an electron beam (acceleration voltage: 30 kV, dose: 2000 to 5500 µC/cm$^2$).

Furthermore, the resultant was immersed in a BHF (2.4% for 2 minutes) as a developer so that the electron beam-irradiated portion dissolved to form a concave portion, thereby obtaining a mold in which the concave and convex pattern 14 of SOG was formed on the Si substrate 12 as illustrated in FIG. 7(C). The smallest gap between the convex portions of the concave and convex pattern of the mold is 110 nm.

Figure 8:
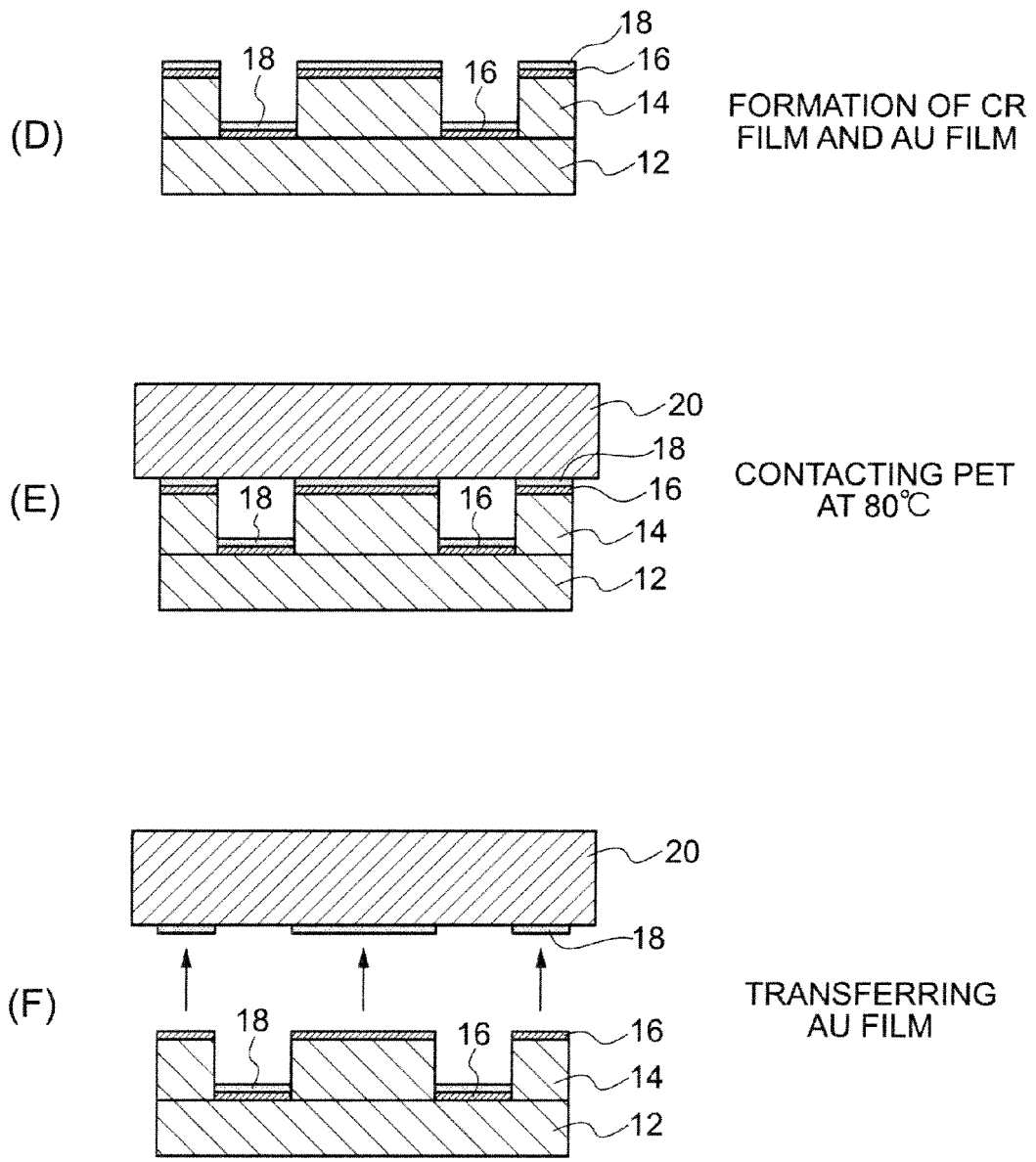
FIG. 8 shows a process for forming the Cr film and the Au film on the mother die produced by the procedure illustrated in FIG. 7, and transferring a part of the Au film to a PET substrate.

Subsequently, as illustrated in FIG. 8(D), the Cr deposited film 16 (thickness: 10 nm) was formed on the obtained mold, and the Au deposited film 18 (thickness: 60 nm) was further formed thereon.

Subsequently, as illustrated in FIG. 8(E), the PET substrate 20 was brought into contact with the Au film 18, and heated at 80° C. for 30 minutes, thereby performing contact printing.

Furthermore, after cooling, the PET substrate 20 was slowly separated to thereby transfer the Au film 18 to the surface of the PET substrate 20 as illustrated in FIG. 8(F).

Comparative Example 3

Figure 9:
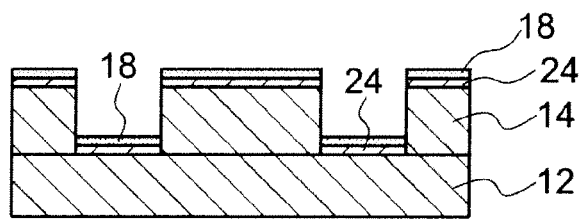
FIG. 9 shows a schematic view illustrating that the Au film is formed through a mold release agent in Comparative Example 3.

As illustrated in FIG. 9, after a mold was produced in a manner substantially similar to that in Example 2, a fluorocarbon-based resin coating agent (trade name: DURASURF HD-1101Z, manufactured by HARVES Co., Ltd.) 24 as a mold release agent was applied to the pattern formation side, and then the Au deposited film 18 was formed thereon.

Figure 10:
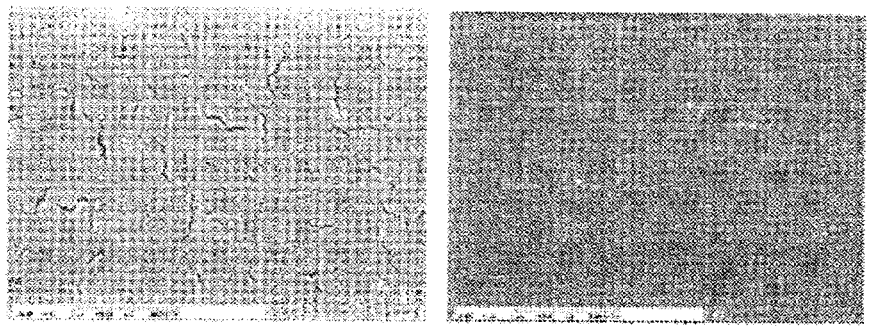
FIG. 10 shows SEM images showing the surface state of an Au deposited film formed on the concave and convex pattern of the mother die.

FIG. 10 shows an SEM image showing the surface state of the Au films each formed in Example 2 and Comparative Example 3. The Au film (FIG. 10(a)) formed in Comparative Example 3 suffered from many cracks. In contrast, the Au film (FIG. 10(b)) formed in Example 2 was smooth.

Figure 11:
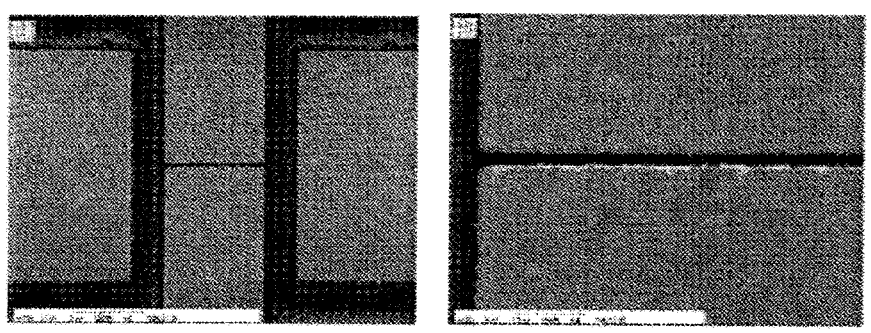
FIG. 11 shows SEM images of the Au film after transfer in Example 2.
Figure 12:
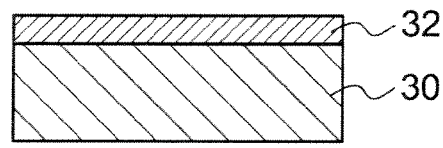
FIG. 12 shows a flow chart illustrating an example of a conventional Au transfer method.
Figure 12:
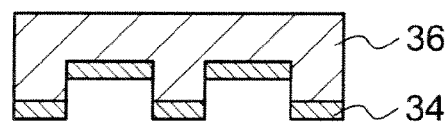
Figure 12:
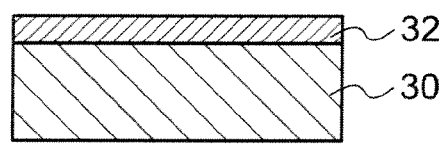
Figure 12:
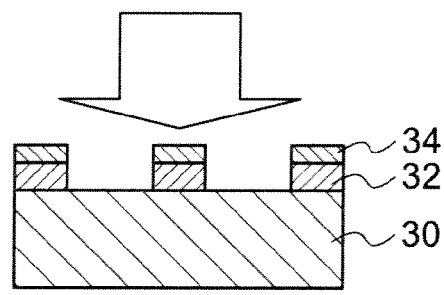
Figure 12:
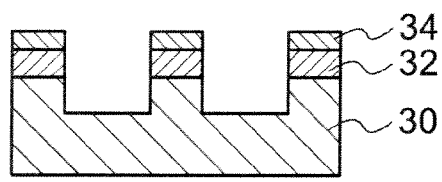
Figure 13:
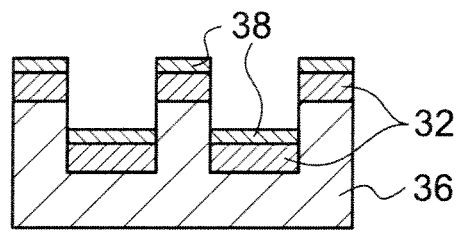
FIG. 13 shows a flow chart illustrating another example of the conventional Au transfer method.
Figure 13:
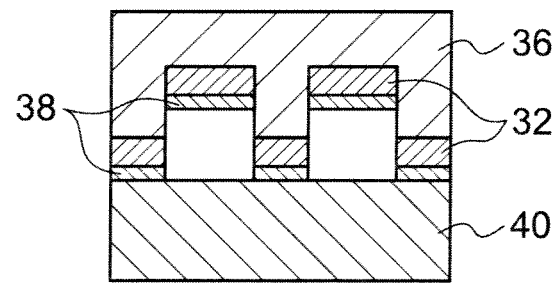
Figure 13:
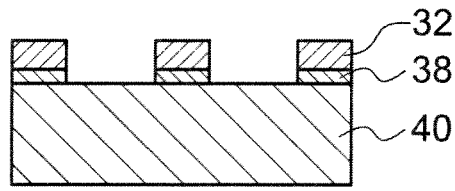

FIG. 11 shows an SEM image obtained by observing the Au film after transferred to the PET substrate in Example 2. The PET film did not sag and was formed without disconnection even in the case of an Au pattern having a line width of about 70 nm.

Example 3

Figure 14:
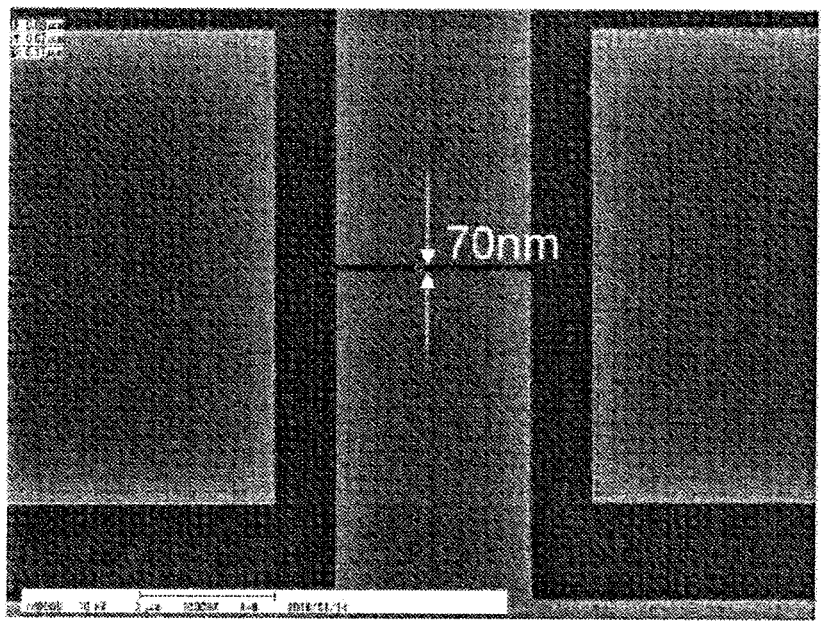
FIG. 14 shows an SEM image (10000 times) showing a concave and convex pattern of a mold in Example 3.

A mold was produced in a manner substantially similar to that in Example 2, except changing the smallest gap between the convex portions of the mold to 70 nm as illustrated in FIG. 14. Subsequently, a Cr deposited film (thickness: 10 nm) was formed to the concave and convex pattern surface of the mold to further form an Au deposited film (thickness: 60 nm).

Figure 15:
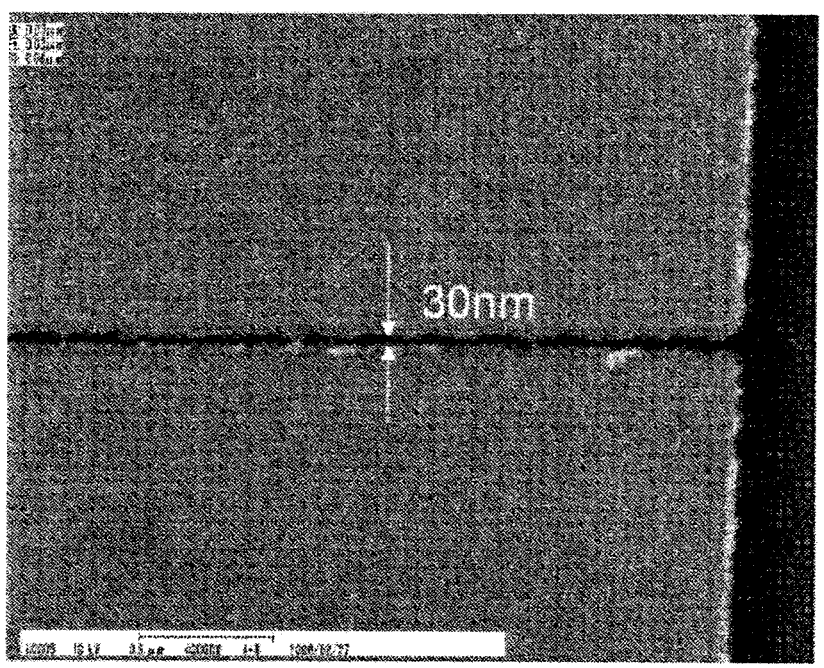
FIG. 15 shows an SEM image (40000 times) of an Au film transferred to a PET film in Example 3.

Subsequently, the Au film was transferred to the PET film in a manner substantially similar to that in Example 2. FIG. 15 shows an SEM image of the Au film transferred to the PET film. The Au film was transferred without disconnection of the line of the Au film, and the gap between the lines of about 30 nm is secured.

Example 4-1

An SOG (trade name: ACCUGLASS (registered trademark) 512B, manufactured by Honeywell, Inc.) was spin coated onto an Si wafer 12, and baked to form an SOG layer (thickness: 500 nm). Arbitrary portions of the SOG layer were irradiated with an electron beam, thereby obtaining a mold on which a concave and convex pattern was formed. In the process, the line width of the electron beam was adjusted to 400 nm, and the depth of the concave portions (grooves) was changed by changing a voltage.

Subsequently, an Al deposited film (thickness: 20 nm) was formed on the SOG concave and convex pattern surface, and a Cu deposited film (thickness: 500 nm) was further formed.

Subsequently, the PET substrate was brought into contact with the Cu film, and heated at 90° C. for 30 minutes, thereby performing contact printing.

After cooling, the PET substrate 20 was slowly separated to thereby transfer the Cu film to the surface of the PET substrate. Thus, the Cu pattern to which the concave and convex pattern of the SOG layer was transferred was transferred onto the PET substrate.

Examples 4-2, 4-3, 4-4

Figure 19:
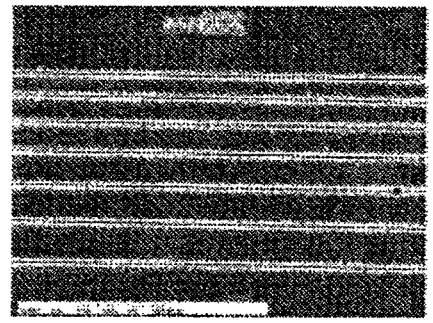
FIG. 19 shows SEM images showing a Cu pattern transferred onto a PET substrate.
Figure 19:
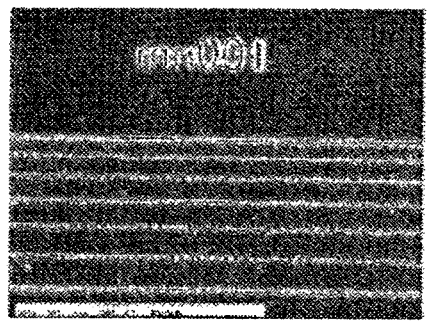

The formation of a SOG concave and convex pattern, film formation of an Al deposited film, film formation of a Cu deposited film, and the transfer of the Cu film to the PET substrate were successively performed in a manner substantially similar to that in Example 4-1, except changing the line width of the electron beam to 300 nm, 200 nm, or 100 nm when forming the SOG concave and convex pattern. FIG. 19 shows SEM images of the Cu pattern transferred onto the PET substrate when the line width was adjusted to 200 nm and 100 nm, respectively. In both the cases, the Cu pattern to which the concave and convex pattern of the SOG layer was transferred is transferred onto the PET substrate. FIG. 19 shows SEM images in which the measurement groove width (gap between lines) of the Cu pattern is 75 nm (in the case of the designed width of 200 nm) or 40 nm (in the case of the designed width of 100 nm), respectively.

Example 5

An SOG layer was formed on an Si substrate in a manner substantially similar to that in Example 4-1, and the second metal film was transferred to the PET substrate by variously changing the first metal film and the second metal film. The transfer state is evaluated by SEM images and the results are shown in Table 2. Cu—Ni in Table 2 represents constantan (alloy of copper and nickel), and the evaluation criteria for A, B, and C is as follows.

A: The second metal film was transferred without disconnection of the line pattern of the second metal film.

B: The second metal film (with no concave and convex pattern) was transferred to the PET substrate.

C: The second metal film was transferred to the PET substrate, but separation or disconnection is partially observed.

TABLE 2

|  |  | Second metal film | | |
|---|---|---|---|---|
|  |  | Cu—Ni | Cu | Au |
| First metal film | Cr | C | — | A |
|  | Al | — | A | B |

Example 6

A first metal film and a second metal film were successively formed on an Si substrate without forming an SOG layer, and then the second metal film was transferred to a PET substrate. The results are shown in Table 3. The evaluation is performed in a manner substantially similar to that in Example 5.

TABLE 3

|  |  | Second metal film | | | |
|---|---|---|---|---|---|
|  |  | Cu—Ni | Ni | Cu | Au |
| First metal film | Cr | C | — | — | B |
|  | Ni | — | C | — | — |
|  | Al | C | — | B | — |

—Analysis of Mold after Transfer—

1. Analysis by SEM-EDX (Energy Dispersion type X-ray spectroscopy)

A mold was produced in a manner substantially similar to that in Example 2, and then a Cr deposited film (thickness: 22 nm) and an Au deposited film (thickness: 50 nm) were successively formed on the pattern surface of the mold. Thereafter, the Au film was transferred to the PET film in a manner substantially similar to that in Example 2.

Figure 16:
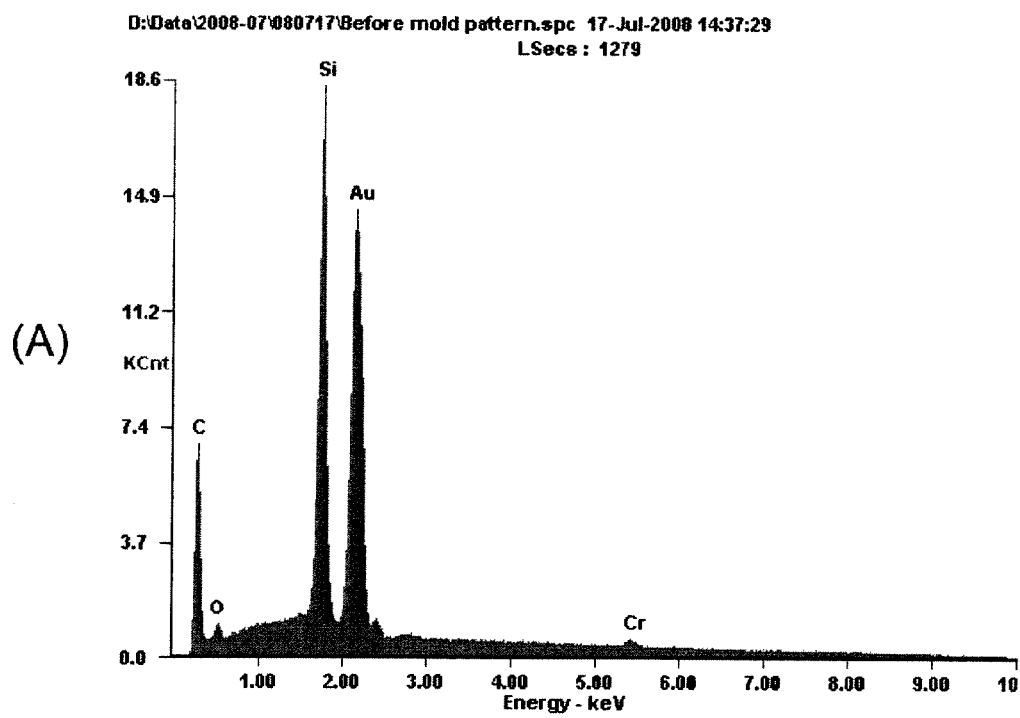
FIG. 16 shows graphs illustrating analysis results by SEM-EDX on the mold surface before and after transfer.
Figure 16:
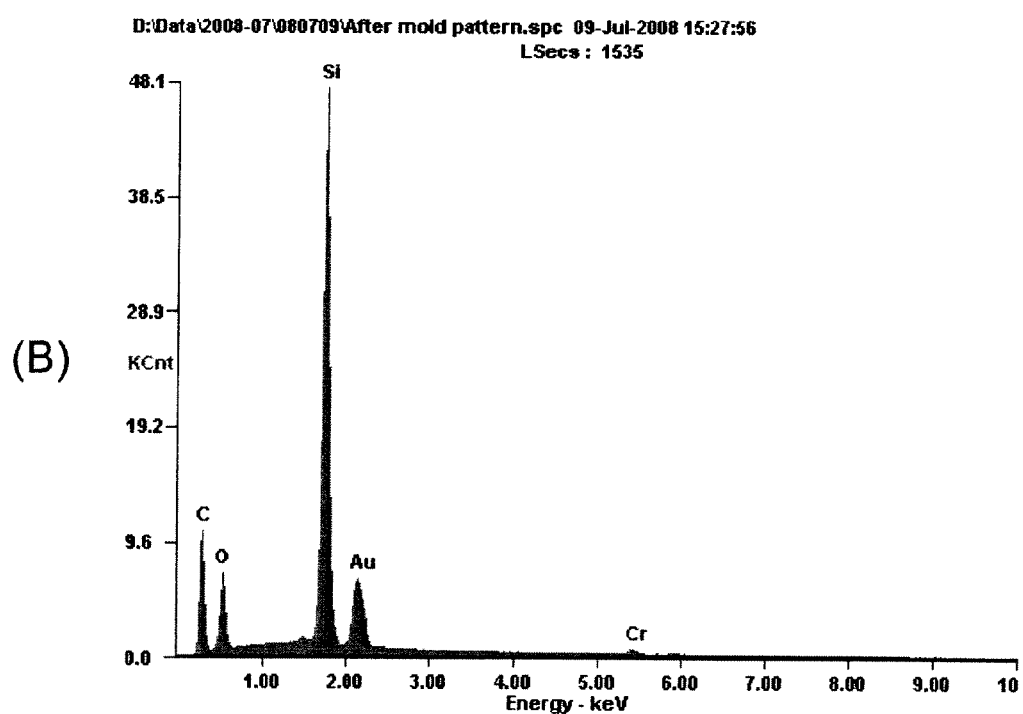

Before and after transfer, the mold surface was analyzed by SEM-EDX. As an SEM-EDX, "ERAX-8900" (trade name), manufactured by Elionix, Inc. was used. FIG. 16(A) shows the analysis results before transfer and FIG. 16(B) shows the analysis results after transfer. The comparison of the results before and after transfer shows that, after transfer, Au sharply decreases and Cr almost remains.

2. Analysis by XPS (X Ray Photoelectron Spectroscopy)

An SOG (trade name: ACCUGLASS (registered trademark) 512B, manufactured by Honeywell, Inc.) was spin coated onto an Si wafer, and baked (pre-heating: 80° C. for 3 minutes, main heating: 425° C. for 1 hour). Subsequently, a Cr deposited film (thickness: 18 nm) was formed, and an Au deposited film (thickness: 50 nm) was further formed. Then, the Au film was transferred to the PET film in a manner substantially similar to that in Example 2.

The mold surface after transfer was analyzed by XPS. As an XPS device, "ESCA5600Ci" (trade name) manufactured by ULVAC-PHI, INCORPORATED was used, and changes in the element distribution in the depth direction were analyzed by gradually sputtering the mold surface.

Figure 17:
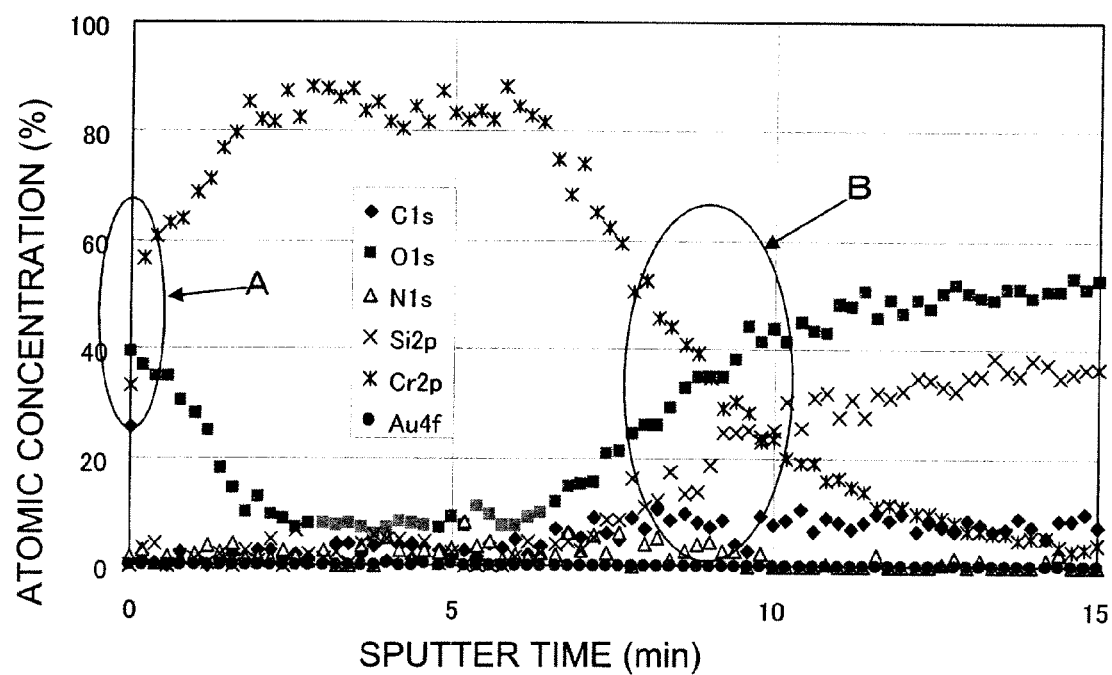
FIG. 17 shows a graph illustrating analysis results of XPS on the mold surface after transfer.

FIG. 17 illustrates the analysis results of XPS. Near the outermost surface indicated by Arrow A, a chromium oxide film, such as $Cr_2O_3$, is formed, and it is considered that the chromium oxide film is effective for mold releasing a gold layer. Then, it is considered that, in a portion where O decreases and Cr increases relative to the outermost surface, a Cr oxide decreases and, in contrast, the proportion of a Cr metal increases. Furthermore, in a region indicated by Arrow B, Cr changes to SOG and a Cr oxide film increases again, and thus it is considered that the adhesiveness with SOG increases.

Figure 18:
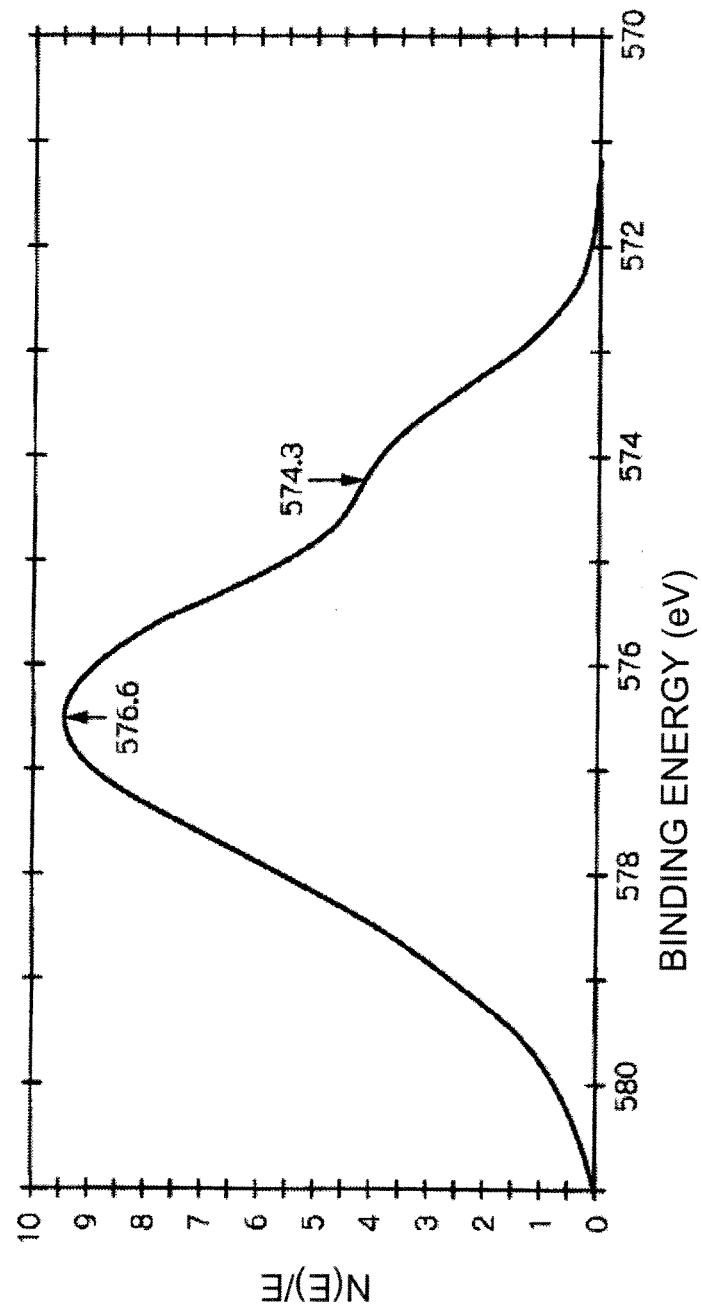
FIG. 18 shows a graph illustrating a spectrum separation ratio of Cr on the outermost surface of the mold after transfer.

FIG. 18 shows a spectrum separation ratio of Cr in the outermost surface, the peak of Cr2O3 appears at 576.6 eV and the peak of Cr metal appears at 574.3 eV. It is considered from the graph that a Cr oxide film is mainly formed on the outermost surface.

INDUSTRIAL APPLICABILITY

The process for producing a structure with a metal film according to the present invention can be applied to various applications. For example, the second metal film obtained after transfer becomes extremely advantageous when used as a catalyst surface or the like because the fine pattern of the mother die is transferred, and thus the surface area can become extremely large. Particularly when a Pt film is formed, the second metal film becomes extremely useful as a catalyst.

When a PET substrate or the like is used as a support member of a side to be transferred, the second metal film formed in convex portions of a mold is transferred to the PET substrate. In this case, metal wiring is relatively easily formed on an insulating substrate, and the second metal film can be advantageously applied when producing a wire grid polarizer, a plasmon element, etc.

When a resin product to which the transfer pattern of the mother die has been transferred is required, the second metal may be dissolved with an appropriate solvent after transfer. Although resins are charged by SEM observation, when the pattern of the support member after transfer is observed by SEM, the charging can be prevented when the resin is covered with a metal film. Therefore, it is considered that the present invention is also effective in a process for reproducing a mold (replica mold production process).

Figure 2:
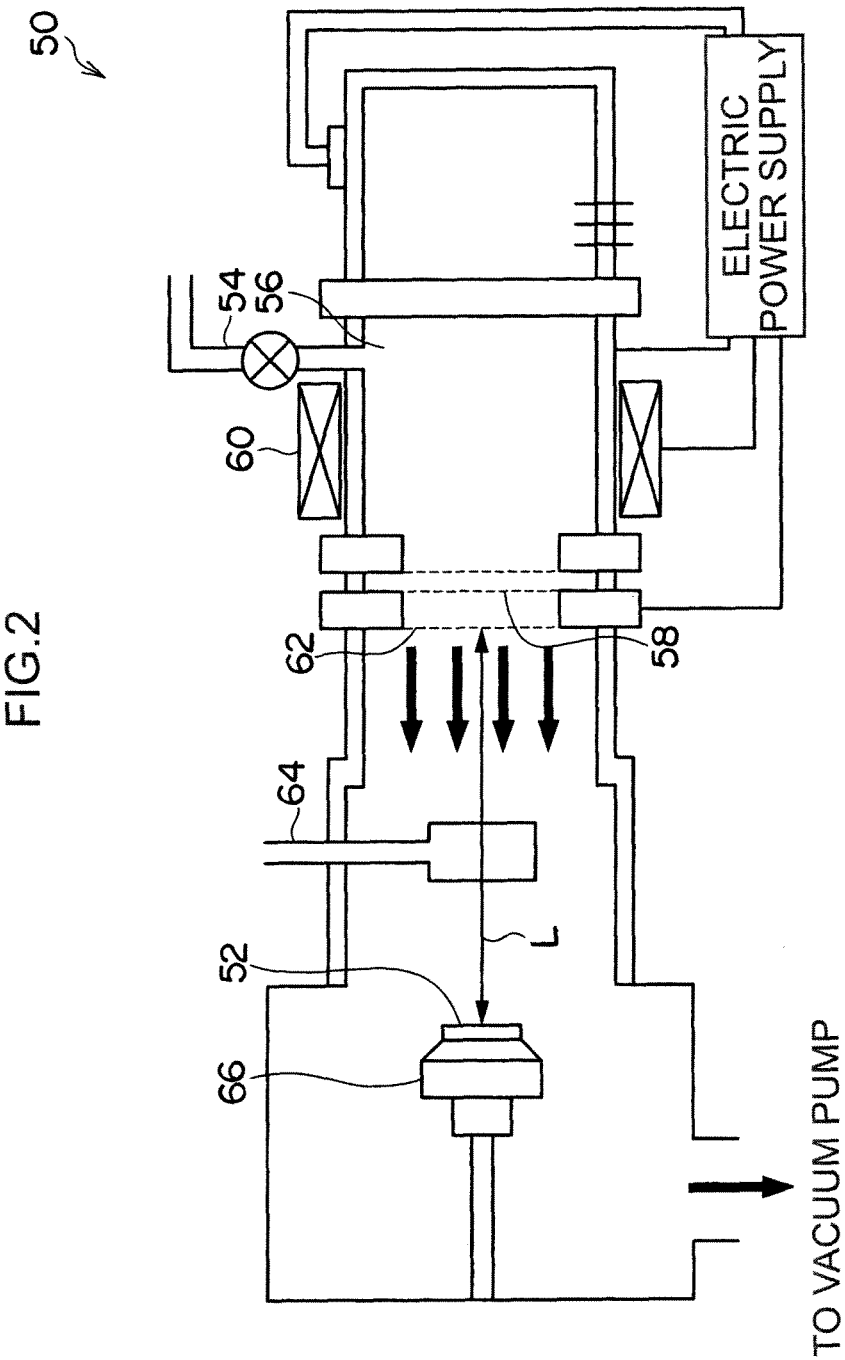
FIG. 2 shows a schematic configuration diagram illustrating an example of an ECR type ion beam processing device.

As described above, the reflection prevention structure according to the present invention is described, but the present invention is not limited to the embodiments and the Examples above. For example, when the mother die according to the present invention is produced using a GC substrate, other processing devices, such as ICP, may be used while not limited to the ECR type ion beam processing device as illustrated in FIG. 2.

The invention claimed is:

1. A process for producing a structure with a metal film, comprising:
preparing a mother die in which a first metal film is formed on a surface of a base on which a concave and convex pattern is formed, wherein the base is a glassy carbon processed by electron cyclotron resonance (ECR) ion beam processing and the metal of the first metal film forms an intermediate layer of a metal carbide between the first metal film and said surface of the base as a result of reaction between the metal of the first metal film with carbon of the glassy carbon of the base,
forming a second metal film on the first metal film so that the concave and convex pattern is transferred to the second metal film,
adhering a support member to the second metal film, and
separating the second metal film and the support member from the first metal film without removing the first metal film from the base, wherein the first metal film has a metal oxide film at an outermost surface of the first metal film, the support member is one selected from the group consisting of resin and glass, and a smallest gap between the convex portions of the concave and convex pattern is in a range of from 30 nm to 110 nm.

2. The process for producing a structure with a metal film according to claim 1, wherein the first metal film is a film containing chromium or aluminum.

3. The process for producing a structure with a metal film according to claim 1, wherein the second metal film is a film containing at least one metal selected from the group consisting of Au, Ag, Cu, Al, and Pt.

4. The process for producing a structure with a metal film according to claim 1, wherein the second metal film is formed by vapor deposition, coating, or plating.

5. The process for producing a structure with a metal film according to claim 1, further comprising supplying a mold release agent between the first metal film and the second metal film.

6. The process for producing a structure with a metal film according to claim 1, wherein the concave and convex pattern is a pattern containing projections having a shape in which the diameter decreases towards a top end.

\* \* \* \* \*